US012800825B2

(12) United States Patent
Chen et al.

(10) Patent No.: US 12,800,825 B2
(45) Date of Patent: Nov. 17, 2026

(54) DISPLAY WITH ANTI-FOGGING FUNCTION

(71) Applicant: AUO Corporation, Hsin-Chu (TW)

(72) Inventors: Hsin-Yu Chen, Hsin-Chu (TW); Yi-Sheng Lin, Hsin-Chu (TW); Ching-Chuan Chen, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 358 days.

(21) Appl. No.: 18/512,080

(22) Filed: Nov. 17, 2023

(65) Prior Publication Data

US 2024/0353612 A1 Oct. 24, 2024

(30) Foreign Application Priority Data

Apr. 21, 2023 (TW) ................................ 112115010
Sep. 28, 2023 (TW) ................................ 112137573

(51) Int. Cl.
*F21V 8/00* (2006.01)
*H05K 7/20* (2006.01)

(52) U.S. Cl.
CPC ....... *G02B 6/0081* (2013.01); *H05K 7/20954* (2013.01)

(58) Field of Classification Search
CPC ................................................. H05K 7/20954
See application file for complete search history.

(56) References Cited

U.S. PATENT DOCUMENTS 7,843,136 B2 11/2010 Ishii et al.
2012/0241127 A1* 9/2012 Watanabe ............. B60H 3/024 62/271
2013/0183894 A1* 7/2013 Watanabe ............ B01D 53/261 454/159
2014/0191220 A1* 7/2014 Watabe .................. H10K 50/11 257/40
2015/0253612 A1* 9/2015 Hasegawa ......... G02F 1/133308 349/58
2016/0014866 A1* 1/2016 Shen ...................... H05B 33/28 362/97.1
2016/0351829 A1* 12/2016 Hosoumi ............... H10K 50/12

FOREIGN PATENT DOCUMENTS

CN 111679359 A 9/2020
CN 216212116 U 4/2022
CN 217718953 U 11/2022

OTHER PUBLICATIONS

China National Intellectual Property Administration has issued 2nd Office Action for the corresponding China application on Aug. 3, 2026.

* cited by examiner

*Primary Examiner* — Christopher E Dunay
(74) *Attorney, Agent, or Firm* — WPAT, PC

(57) ABSTRACT

A display with anti-fogging function includes a display module, a backlight module and an anti-fogging module. The anti-fogging module is disposed behind the display module and corresponding to the backlight module and configured to selectively operate in a first state or a second state. When the display is not activated, the backlight module is turned off, and the anti-fogging module operates in the first state to absorb moisture inside the display. When the display is activated, the backlight module is turned on and generates heat, and the anti-fogging module operates in the second state to be heated to release the absorbed moisture.

18 Claims, 9 Drawing Sheets

DP

DISPLAY WITH ANTI-FOGGING FUNCTION

CROSS REFERENCE TO THE RELATED APPLICATION

The application claims the priority benefit of Taiwan Application No. 112115010, filed on Apr. 21, 2023 and Taiwan Application No. 112137573, filed on Sep. 28, 2023. The entirety of each of the mentioned above patent applications is hereby incorporated by reference herein and made a part of this specification.

BACKGROUND OF THE INVENTION

1. Field of the Invention

The invention relates to a display; in particular, to a display with anti-fogging function.

2. Description of the Prior Art

In the prior art, there is an air layer between a panel and lens in a display. When the display is activated, the panel operates to generate heat to make the air layer heat up first. However, the lens that has not been heated up at this time still maintains a relatively low temperature, causing the moisture in the air layer to condense on the lens to form a fog surface when it is cooled, which affects the normal viewing of the user. And, the fog on the lens will not disappear until the temperature of the lens rises.

SUMMARY OF THE INVENTION

Therefore, the invention provides a display with anti-fogging function to solve the above-mentioned problems of the prior arts.

A preferred embodiment of the invention is a display with anti-fogging function. In this embodiment, the display with anti-fogging function includes a display module, a backlight module and an anti-fogging module. The anti-fogging module is disposed behind the display module and corresponding to the backlight module and configured to selectively operate in a first state or a second state. When the display is not activated, the backlight module is turned off, and the anti-fogging module operates in the first state to absorb moisture inside the display. When the display is activated, the backlight module is turned on and generates heat, and the anti-fogging module operates in the second state to be heated to release the absorbed moisture.

In an embodiment, the anti-fogging module is a desiccant box, and the desiccant box includes a box body and a desiccant contained in the box body.

In an embodiment, the desiccant is a silica gel desiccant.

In an embodiment, the display also includes a transparent cover, and there is an air layer between the transparent cover and the display module. When the anti-fogging module operates in the first state, the anti-fogging module absorbs the moisture in the air layer; when the anti-fogging module operates in the second state, the anti-fogging module is heated to release the moisture into the air layer.

In an embodiment, the anti-fogging module and the backlight module are disposed on the same side of the display module.

In an embodiment, the backlight module is a direct-type backlight module and includes a plurality of light-emitting units disposed at intervals on a bottom edge of the backlight module; the anti-fogging module and the plurality of light-emitting units are at least partially overlap in a vertical projection direction of a display surface of the display module.

In an embodiment, the backlight module is an edge-lit backlight module and includes a plurality of light-emitting units disposed at intervals on a side of the backlight module; the anti-fogging module and the plurality of light-emitting units are at least partially overlap in a vertical projection direction of a display surface of the display module.

In an embodiment, the display is applied to a vehicle and disposed corresponding to an engine. When the vehicle is started, both the backlight module and the engine start to operate to generate heat, and the anti-fogging module operating in the second state is heated to release the moisture previously absorbed.

Another preferred embodiment of the invention is a display with anti-fogging function. In this embodiment, the display with anti-fogging function includes a display module, a backlight module and an anti-fogging module. The display module has a display surface. The backlight module includes a plurality of light-emitting units. The anti-fogging module is disposed on the same side of the display module with the backlight module, and the anti-fogging module and the plurality of light-emitting units are at least partially overlap in a vertical projection direction of the display surface.

In an embodiment, when the display is not activated, the backlight module is turned off, and the anti-fogging module operates in a first state to absorb moisture inside the display; when the display is activated, the backlight module is turned on and generates heat, and the anti-fogging module operates in a second state to be heated to release the absorbed moisture.

In an embodiment, the anti-fogging module is a desiccant box, and the desiccant box includes a box body and a desiccant contained in the box body.

In an embodiment, the desiccant is a silica gel desiccant.

In an embodiment, the display with anti-fogging function further includes a transparent cover. There is an air layer between the transparent cover and the display module. When the anti-fogging module operates in the first state, the anti-fogging module absorbs the moisture in the air layer. When the anti-fogging module operates in the second state, the anti-fogging module is heated to release the moisture into the air layer.

In an embodiment, the backlight module is a direct-type backlight module and the plurality of light-emitting units is disposed at intervals on a bottom edge of the backlight module.

In an embodiment, the backlight module is an edge-lit backlight module and the plurality of light-emitting units is disposed at intervals on a side of the backlight module.

In an embodiment, the display is applied to a vehicle and disposed corresponding to an engine, when the vehicle is activated, both the backlight module and the engine start to operate to generate heat, and the anti-fogging module operating in the second state is heated to release the moisture previously absorbed.

Compared to the prior art, a desiccant box equipped with a silica gel desiccant is disposed behind a display panel in a display with anti-fogging function of the invention. Since the silica gel desiccant is capable of absorbing moisture, the lens surface that is heated up later will not be fogged to improve the viewing experience satisfaction of the user, and the silica gel desiccant can be heated at high temperature to react to release the moisture previously absorbed, so that the silica gel desiccant can return to the state capable of absorbing moisture, and the effect of recycling can be achieved to effectively reduce cost.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

Figure 1:
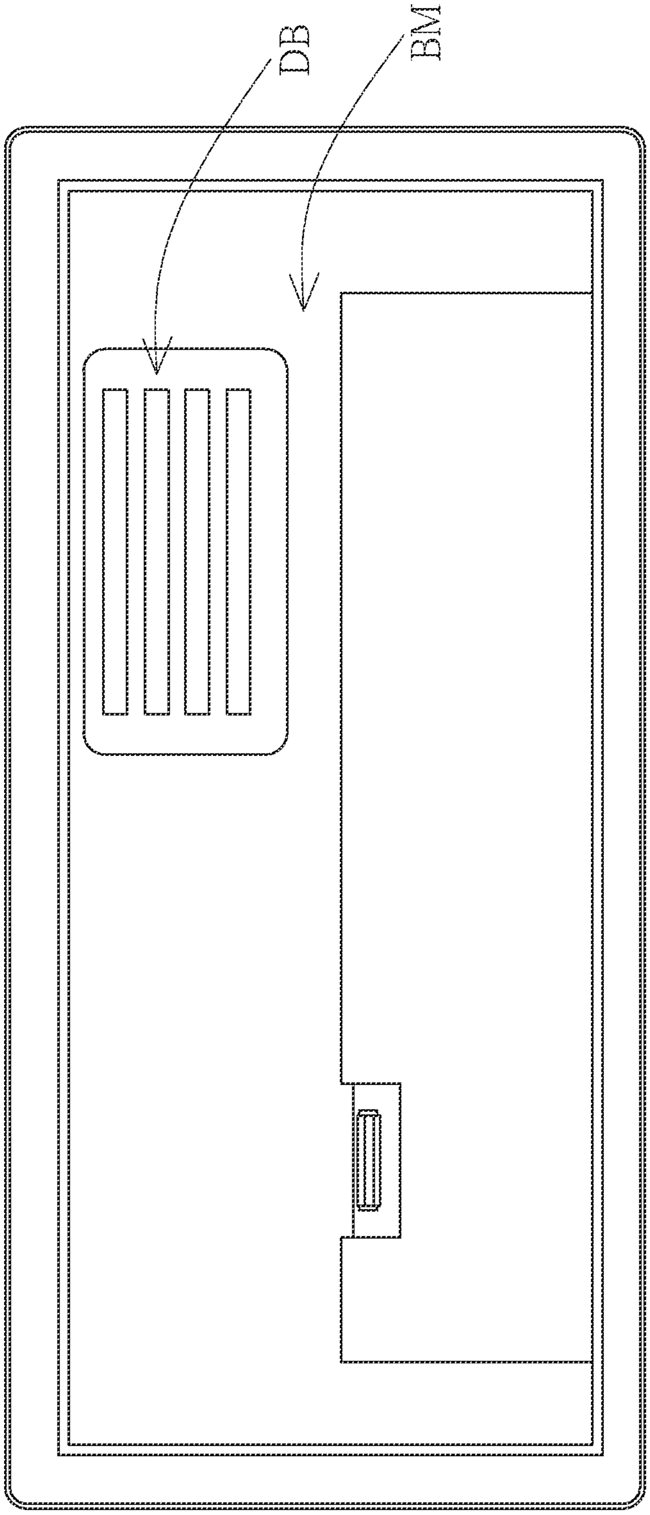
FIG. 1 and FIG. 2 illustrate a rear view and a side view of a display with anti-fogging function in a first embodiment of the invention respectively.

The following specific embodiments are used together with FIG. 1 to FIG. 9 to illustrate the disclosed embodiments of the invention. Those skilled in the art can understand the advantages and effects of the invention from the contents disclosed in this specification. However, the content disclosed below is not intended to limit the protection scope of the invention. Those skilled in the art can implement the invention in other different embodiments based on different viewpoints and applications without departing from the spirit of the invention.

For the sake of clarity, the drawings shown in the invention are all simplified schematic diagrams to illustrate the basic structure of the invention. Therefore, the structures shown in the drawings of the invention are not drawn according to the shape and scale of actual implementation. For example, the dimensions of certain elements have been exaggerated for convenience of illustration.

Furthermore, it will be understood that when an element such as a layer, film, region, or substrate is referred to as being "on" or "connected to" another element, it can be directly on or in conjunction with the other element. One element is connected, or intermediate elements may also be present. In contrast, when an element is referred to as being "directly on" or "directly connected to" another element, there are no intervening elements present. As used herein, "connected" may refer to physical and/or electrical connection. Furthermore, "electrically connected" or "coupled" means that other elements exist between two elements.

Unless otherwise defined, all terms (including technical and scientific terms) used herein have the same meaning as commonly understood by one of ordinary skill in the art to which this invention belongs. It will be further understood that terms such as those defined in commonly used dictionaries should be interpreted to have meanings consistent with their meanings in the context of the relevant art and the invention, and will not be interpreted as idealized or excessive formal meaning, unless expressly so defined herein.

In addition, it should be understood that although the terms "first", "second", "third" and the like may be used herein to describe various elements, components, regions, layers and/or sections, these elements, components, area, and/or section shall not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The First Embodiment

The following describes a display DP with anti-fogging function in the first embodiment of the invention with reference to FIG. 1 to FIG. 4.

Figure 2:
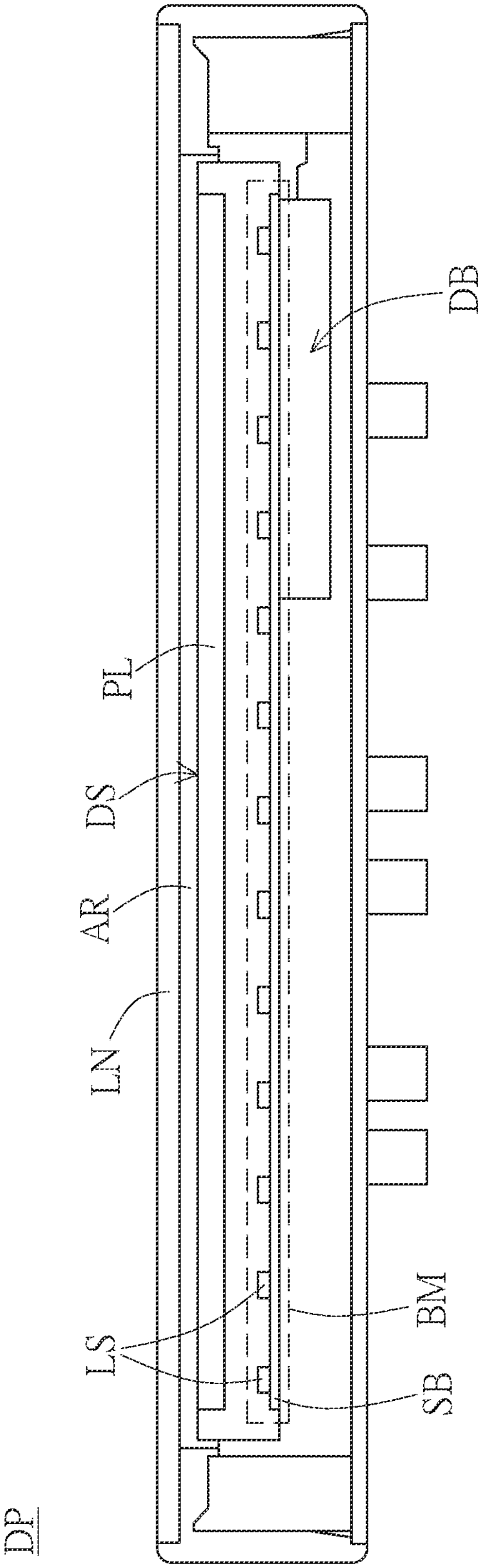

Please refer to FIG. 1 and FIG. 2. FIG. 1 and FIG. 2 illustrate a rear view and a side view of the display DP with anti-fogging function in the first embodiment of the invention respectively. As shown in FIG. 1 and FIG. 2, the display DP with anti-fogging function includes a transparent cover LN, a display module PL, a backlight module BM and an anti-fogging module DB. The backlight module BM includes a plurality of light emitting units LS.

It should be noted that the display module PL in this embodiment has a display surface DS, and the display module PL can be any type of non-self-luminous display panel, such as a liquid crystal panel; the backlight module BM in this embodiment is a direct-type (bottom backlight type) backlight module, and the plurality of light-emitting units LS are disposed at intervals on a back plate SB of the backlight module BM. The plurality of light-emitting units LS can be any type of light-emitting elements, such as light-emitting diodes (LEDs); the anti-fogging module DB in this embodiment can be a hygroscopic module such as a desiccant box, and the desiccant box can include a box body and a desiccant contained in the box; the desiccant can be a silicone desiccant, which has the ability to absorb moisture and will react to release the previously absorbed moisture after being heated, but not limited to this.

The transparent cover LN is disposed in front of the display module PL and there is an air layer AR between the transparent cover LN and the display module PL. The backlight module BM is disposed behind the display module PL. The anti-fogging module DB is disposed behind the display module PL and corresponds to the backlight module BM.

In this embodiment, the anti-fogging module DB and the plurality of light-emitting units LS in the backlight module BM at least partially overlap in a vertical projection direction of the display surface DS, and they may even completely overlap in the vertical projection direction of the display surface DS, but not limited to this. Specifically, on an extended virtual plane parallel to the display surface DS, the vertical projection range of the anti-fogging module DB at least covers the vertical projection range of a part of the light-emitting units LS. In one embodiment, the anti-fogging module DB can be disposed and attached to a side of the backplane SB opposite to the light-emitting units LS; in different embodiments, the anti-fogging module DB can also be disposed on a back casing of the backlight module BM, but not limited to this.

Figure 3:
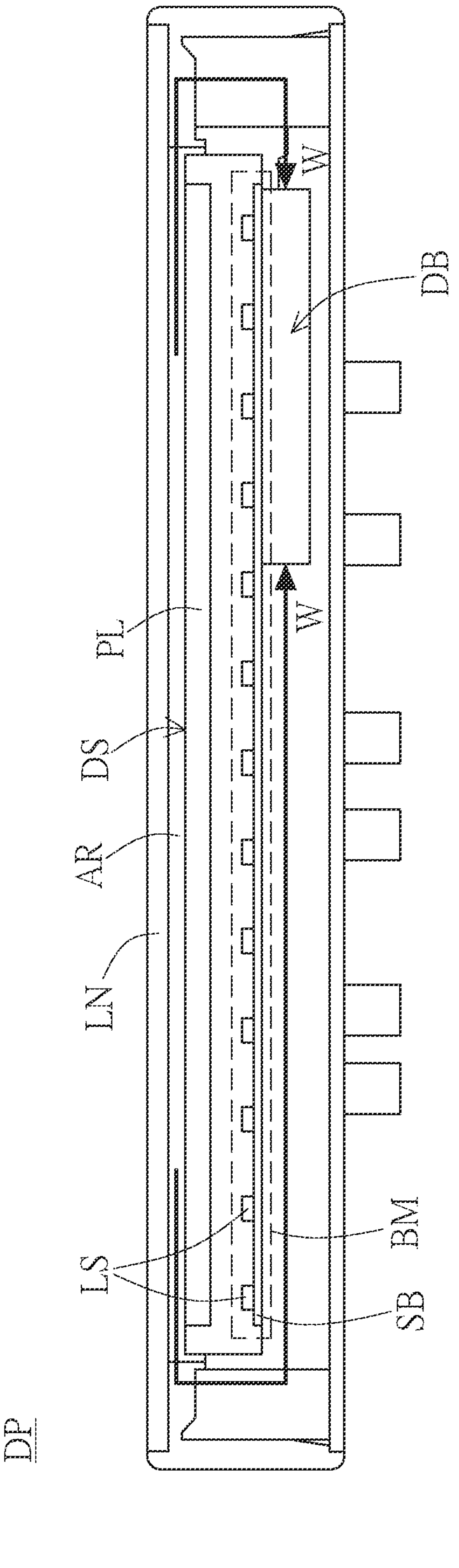
FIG. 3 illustrates a schematic diagram of the display with anti-fogging function in FIG. 2 operating in a first state.
Figure 4:
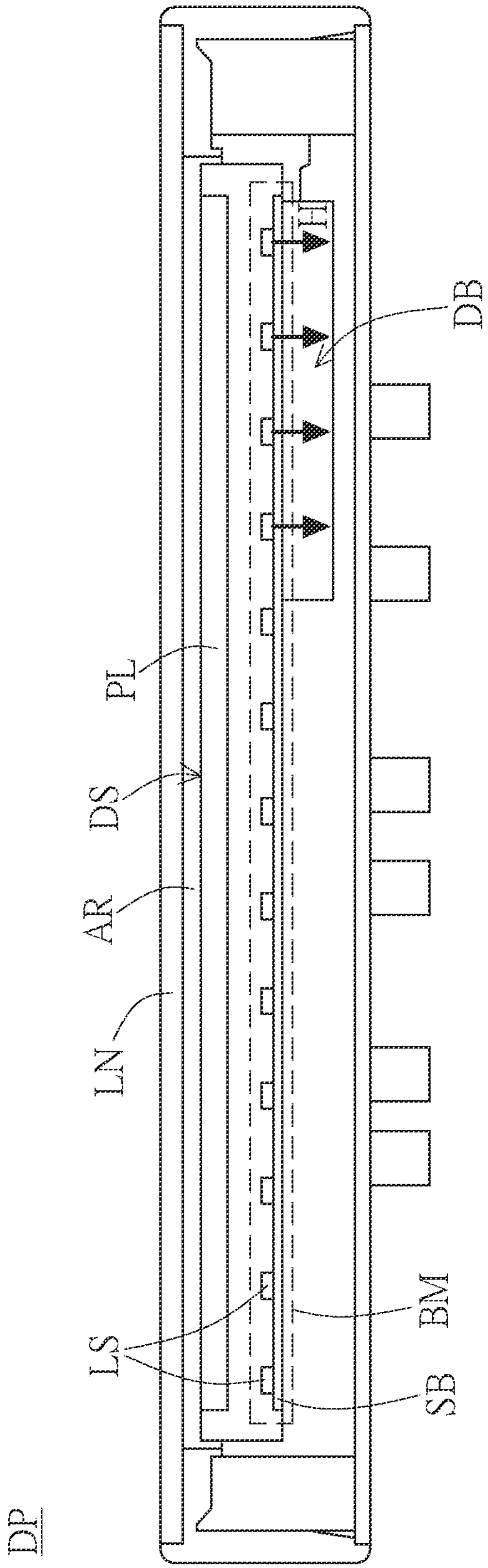
FIG. 4 illustrates a schematic diagram of the display with anti-fogging function in FIG. 2 operating in a second state.

In fact, the anti-fogging module DB can selectively operate in a first state or a second state. Please refer to FIG. 3 and FIG. 4. FIG. 3 and FIG. 4 illustrate schematic diagrams of the anti-fogging module DB in FIG. 2 operating in the first state and the second state respectively.

As shown in FIG. 3, when the display DP with the anti-fogging function does not activate or display, its backlight module BM is turned off, and the plurality of light-emitting units LS does not emit lights and no heat is generated. At this time, the anti-fogging module DB operates in the first state and absorbs the moisture W inside the display DP, such as the moisture W in the air layer AR between the transparent cover LN and the display module PL, but not limited to this.

As shown in FIG. 4, when the display DP with the anti-fogging function activates or displays, its backlight module BM starts to operate, and the plurality of light-emitting units LS starts to emit backlights and generate heat H. Since the position of the anti-fogging module DB corresponds to that of the light-emitting units LS, the heat H will be transferred to the anti-fogging module DB via conduction or other means through the back plane SB or other media. At this time, the anti-fogging module DB is heated by the heat H and changes from the original first state to the second state, and begins to release the previously absorbed moisture W into the internal space of the display DP, such as the air layer AR between the transparent cover LN and the display module PL, but not limited to this.

From the above, it can be known that the display DP with anti-fogging function in this embodiment can effectively avoid fogging of the transparent cover LN that heats up later through the moisture absorption characteristics of the silicone desiccant in the anti-fogging module DB, and the silicone desiccant in the anti-fogging module DB can be recycled repeatedly, so that the cost can be effectively reduced. In addition, when the plurality of light-emitting units LS is turned on, the anti-fogging module DB can also achieve the effect of assisting the heat dissipation of the light-emitting units LS.

The Second Embodiment

Figure 5:
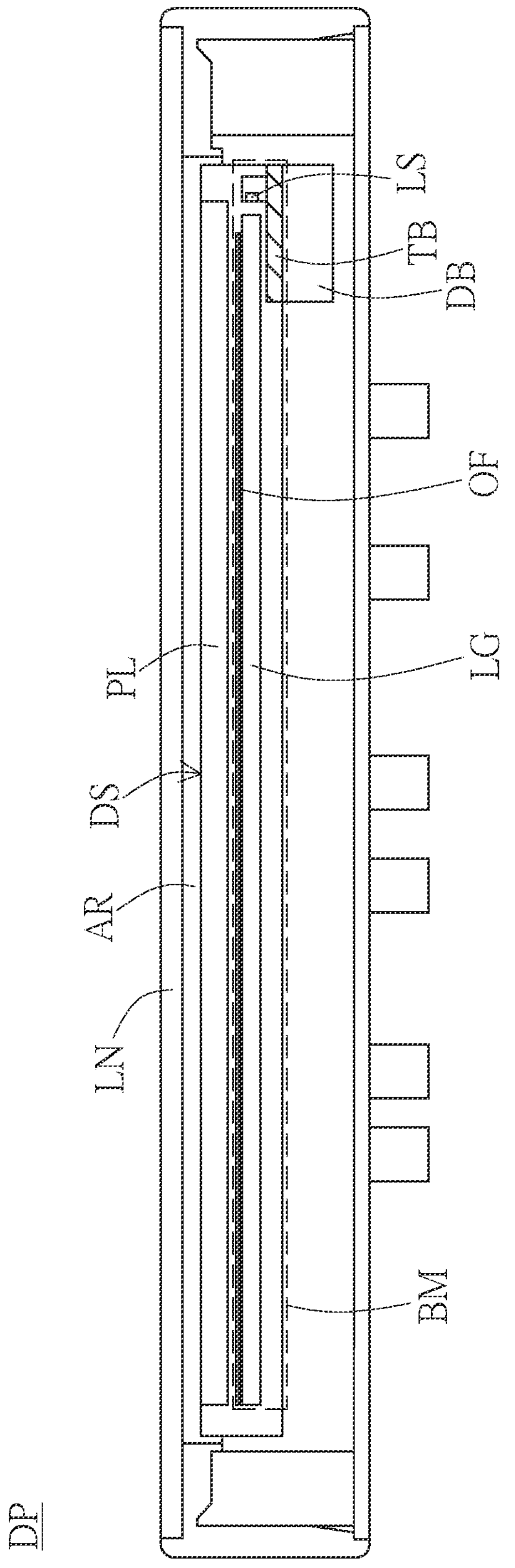
FIG. 5 illustrates a schematic diagram of a display with anti-fogging function in a second embodiment of the invention.
Figure 6:
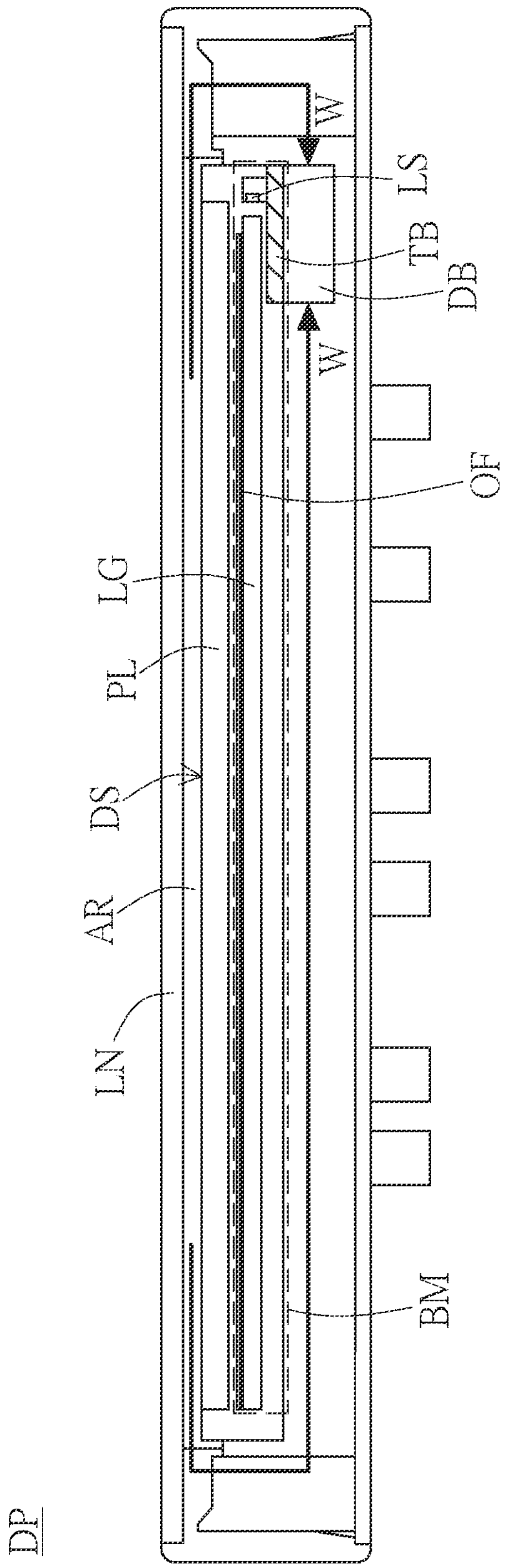
FIG. 6 illustrates a schematic diagram of the display with anti-fogging function in FIG. 5 operating in a first state.
Figure 7:
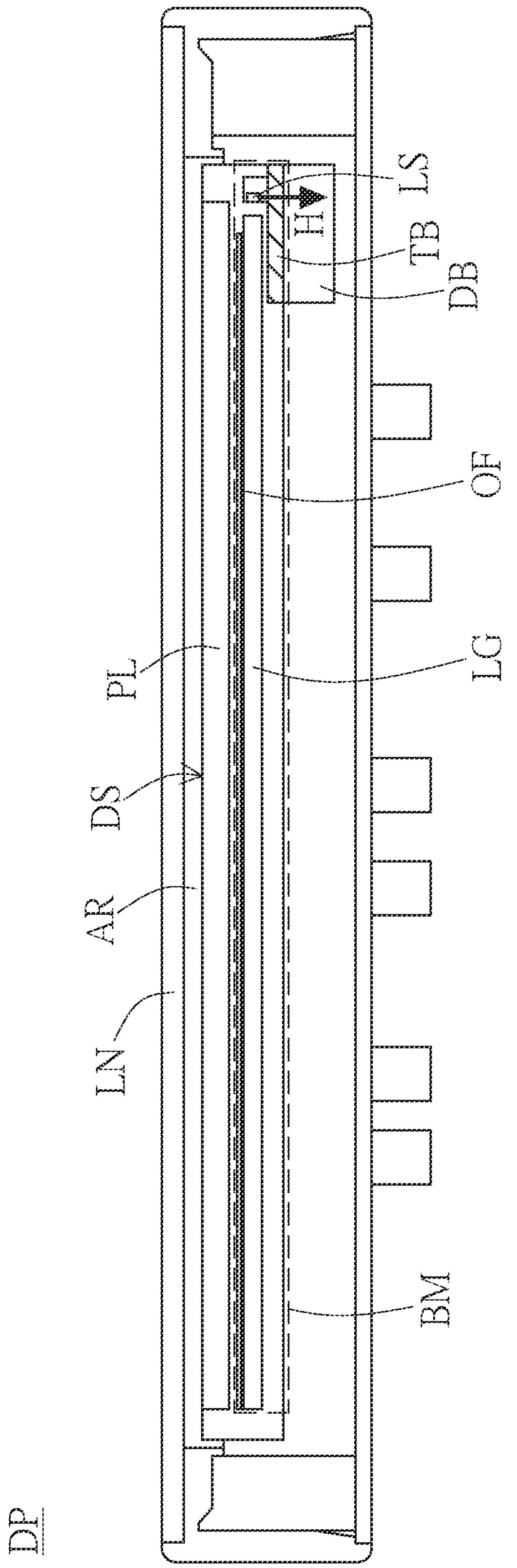
FIG. 7 illustrates a schematic diagram of the display with anti-fogging function in FIG. 5 operating in a second state.

The following describes a display DP with anti-fogging function in the second embodiment of the invention with reference to FIG. 5 to FIG. 7.

Please refer to FIG. 5. FIG. 5 illustrates a schematic diagram of the display with anti-fogging function in the second embodiment of the invention. As shown in FIG. 5, the display DP with anti-fogging function includes a transparent cover LN, a display module PL, a backlight module BM and an anti-fogging module DB. The backlight module BM includes a plurality of light emitting units LS.

It should be noted that the backlight module BM in this embodiment is an edge-lit backlight module and the plurality of light-emitting units LS are disposed at intervals on a side of the backlight module BM. Specifically, the backlight module BM has a light guide plate LG and a light source circuit board TB. The light source circuit board TB is in a strip shape and disposed on a side of the light guide plate LG, and a plurality of light-emitting units LS is located on the light source circuit board TB and disposed at intervals on the side of the light guide plate LG, that is, on the side of the entire backlight module BM to form a strip-shaped distribution. The backlight module BM also has a light guide film OF disposed between the light guide plate LG and the display module PL. The plurality of light-emitting units LS can be any type of light-emitting components, such as light-emitting diodes (LEDs). The anti-fogging module DB in this embodiment can be a moisture absorption module such as a desiccant box, and the desiccant box can include a box body and a desiccant contained in the box body; the desiccant can be a silicone desiccant having the ability to absorb moisture and will react to release the previously absorbed moisture after being heated, but not limited to this.

The transparent cover LN is disposed in front of the display module PL, and there is an air layer AR between the transparent cover LN and the display module PL. The backlight module BM is disposed behind the display module PL. The anti-fogging module DB is disposed behind the display module PL and corresponds to the backlight module BM.

In this embodiment, the anti-fogging module DB and the plurality of light-emitting units LS in the backlight module BM at least partially overlap in the vertical projection direction of the display surface DS, and they may even completely overlap in the vertical projection direction of the display surface DS, but not limited to this. Specifically, on the extended virtual plane parallel to the display surface DS, the vertical projection range of the anti-fogging module DB at least covers the vertical projection range of a part of the light-emitting units LS. From another perspective, the vertical projection range of the anti-fogging module DB at least covers the vertical projection range of a part of the light source circuit board TB. In addition, the vertical projection range of the anti-fogging module DB can also cover a part of the vertical projection range of the side of the light guide plate LG close to the light-emitting units LS. Specifically, the anti-fogging module DB can be attached to the side of the light source circuit board TB opposite to the light-emitting units LS; in different embodiments, the backlight module BM can also be provided with a backside housing to carry the light guide plate LG, the light source circuit board TB and the light emitting unit LS inside, and the anti-fogging module DB can also be disposed on the side of the backside housing opposite to the light source circuit board TB, but not limited to this.

In fact, the anti-fogging module DB can selectively operate in the first state or the second state. Please refer to FIG. 6 and FIG. 7. FIG. 6 and FIG. 7 illustrate schematic diagrams of the anti-fogging module DB in FIG. 5 operating in the first state and the second state respectively.

As shown in FIG. 6, when the display DP with the anti-fogging function does not activate or display, its backlight module BM is turned off, and the plurality of light-emitting units LS does not emit lights and no heat is generated. At this time, the anti-fogging module DB operates in the first state and absorbs the moisture W inside the display DP, such as the moisture W in the air layer AR between the transparent cover LN and the display module PL, but not limited to this.

As shown in FIG. 7, when the display DP with the anti-fogging function activates or displays, its backlight module BM starts to operate, and the plurality of light-emitting units LS starts to emit backlight L and generate heat H. Since the position of the anti-fogging module DB corresponds to that of the light-emitting units LS, the heat H will be transmitted to the anti-fogging module DB via conduction or other means through the light source circuit board TB or other media. At this time, the anti-fogging module DB is heated by the heat H and changes from the original first state to the second state, and begins to release the previously absorbed moisture W into the internal space of the display DP, such as the air layer AR between the transparent cover LN and the display module PL, but not limited to this.

From the above, it can be known that the display DP with anti-fogging function in this embodiment can effectively avoid fogging of the transparent cover LN that heats up later through the moisture absorption characteristics of the silicone desiccant in the anti-fogging module DB, and the silicone desiccant in the anti-fogging module DB can be recycled repeatedly, so that the cost can be effectively reduced. In addition, when the light-emitting units LS are turned on, the anti-fogging module DB can also achieve the effect of assisting the heat dissipation of the light-emitting units LS.

Figure 8:
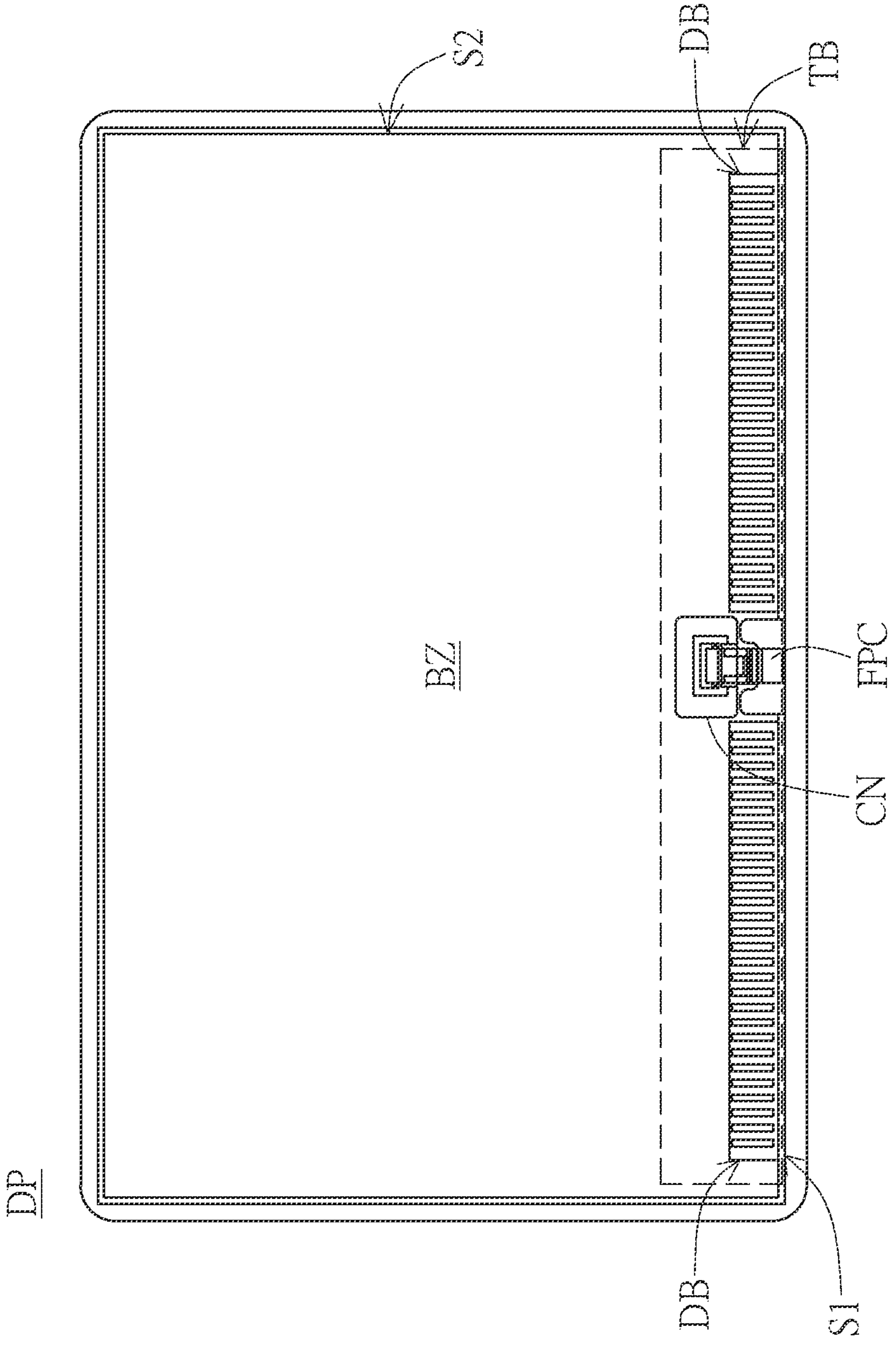
FIG. 8 and FIG. 9 illustrate different variations of the second embodiment of the invention respectively.

Please refer to FIG. 8. FIG. 8 illustrates a variation of the second embodiment of the invention. It should be noted that since the backlight module BM in this embodiment includes a backside housing BZ covering the light source circuit board TB, and the position of the light source circuit board TB is indicated by a dotted line.

As shown in FIG. 8, the backlight module BM is an edge-lit backlight module and includes a plurality of light-emitting units LS. The backlight module BM and the anti-fogging module DB are disposed adjacent to a bottom edge SI of the display DP. The anti-fogging module DB and the plurality of light-emitting units LS in the backlight module BM at least partially overlap in a vertical projection direction, and they may even completely overlap in the vertical projection direction, but not limited to this.

In this embodiment, the light source circuit board TB has a signal conduction unit FPC for transmitting signals, such as a flexible circuit board. The signal conduction unit FPC is connected to an external signal source through a connector CN on the backside housing BZ. As shown in FIG. 8, the signal conduction unit FPC is disposed in the center of the bottom edge of the light source circuit board TB, while the anti-fogging module DB can be separately disposed on both sides of the signal conduction unit FPC and the connector CN, but not limited to this.

It should be noted that if the size the anti-fogging module DB is too large, it will not only affect the wiring in the display DP, but also the silicone desiccant in the anti-fogging module DB does not have a good effect in releasing moisture W when heated in other places with low-temperature. Therefore, it is preferred that the size of the anti-fogging module DB is equivalent to that of the backlight module BM.

Figure 9:
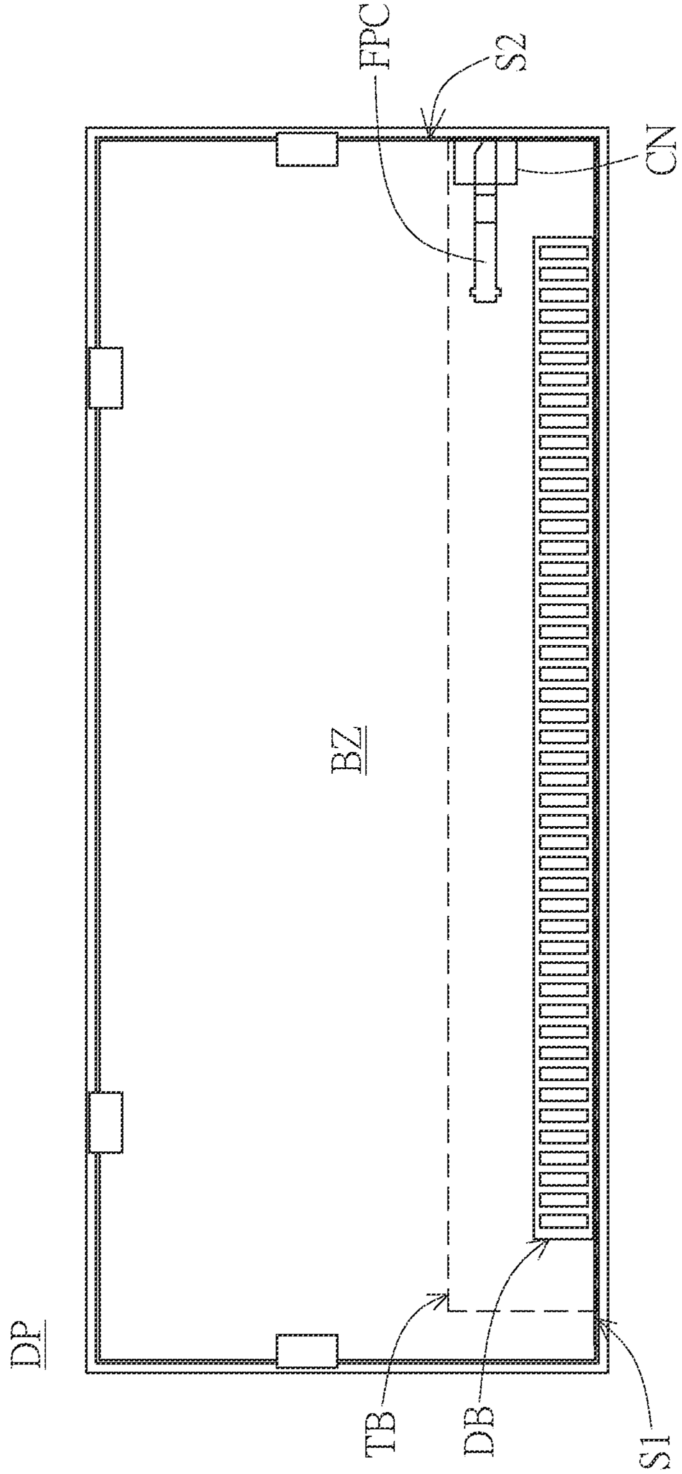

Please refer to FIG. 9. FIG. 8 illustrates another variation of the second embodiment of the invention. It should be noted that since the backlight module BM in this embodiment includes a backside housing BZ covering the light source circuit board TB, and the position of the light source circuit board TB is indicated by a dotted line.

As shown in FIG. 9, the backlight module BM is an edge-lit backlight module and includes a plurality of light-emitting units LS. The backlight module BM and the anti-fogging module DB are disposed adjacent to the bottom edge SI of the display DP. The anti-fogging module DB and the plurality of light-emitting units LS in the backlight module BM at least partially overlap in a vertical projection direction, and they may even completely overlap in the vertical projection direction, but not limited to this.

In this embodiment, the light source circuit board TB has a signal conduction unit FPC for transmitting signals, such as a flexible circuit board. The signal conduction unit FPC is connected to an external signal source through the connector CN on the backside housing BZ. As shown in FIG. 9, the signal conduction unit FPC is disposed on a side of the light source circuit board TB, and the anti-fogging module DB can be disposed on the bottom edge of the light source circuit board TB. Therefore, the overlapping area ratio and range of the anti-fogging module DB and the light-emitting unit LS on the light source circuit board TB can become larger, thereby increasing the efficiency of moisture absorption and heat absorption.

It should be noted that if the size of the anti-fogging module DB is too large, it will not only affect the wiring in the display DP, but also the silicone desiccant in the anti-fogging module DB does not have a good effect in releasing moisture W when heated in other places with low-temperature. Therefore, it is preferred that the size of the anti-fogging module DB is equivalent to that of the backlight module BM.

In practical applications, the display DP with anti-fogging function disclosed in the invention can be applied to various application fields and situations.

For example, the display DP with anti-fogging function can be a vehicle display, which can be applied in a vehicle and disposed corresponding to the engine. When the vehicle does not activate, the backlight module BM of the display DP and the engine of the vehicle are turned off. At this time, the anti-fogging module DB of the display DP will operate in the first state to absorb the moisture W in the air layer AR to avoid fogging of the transparent cover LN of the display DP. When the vehicle activates, the backlight module BM of the display DP and the engine of the vehicle start to operate and generate heat H. At this time, the anti-fogging module DB of the display DP will be heated by the heat H and change from the first state to the second state, and begin to release the previously absorbed moisture W to the air layer AR, thereby achieving the effect of repeated recycling.

Above all, a desiccant box equipped with a silica gel desiccant is disposed behind the display panel in the display with anti-fogging function of the invention. Since the silica gel desiccant is capable of absorbing moisture, the lens surface that is heated up later will not be fogged to improve the viewing experience satisfaction of the user, and the silica gel desiccant can be heated at high temperature to react to release the previously absorbed moisture, so that the silica gel desiccant can return to the state capable of absorbing moisture, and the effect of recycling can be achieved to effectively reduce cost.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A display with anti-fogging function, comprising:

a display module;

a transparent cover disconnected from and adjacent to the display module. forming an interposing air layer therebetween;

a backlight module having a first side facing the display module; and an anti-fogging module, disposed on a second side of the backlight module and not facing the display module, configured to selectively operate in a first state or a second state;

wherein when the display is not activated, the backlight module is turned off, and the anti-fogging module operates in the first state to absorb moisture inside the display;

wherein when the display is activated, the backlight module is turned on and generates heat, and the anti-fogging module operates in the second state to be heated to release the absorbed moisture;

wherein the anti-fogging module comprises a desiccant box attached to a back plane or a light source circuit board of the backlight module, configured to receive heat from the backlight module via conduction directly from the backplate or the light source circuit board and via convection from the air layer.

2. The display with anti-fogging function of claim 1, wherein the desiccant box comprises a box body and a desiccant contained in the box body.

3. The display with anti-fogging function of claim 2, wherein the desiccant is a silica gel desiccant.

4. The display with anti-fogging function of claim 1, wherein when the anti-fogging module operates in the first state, the anti-fogging module absorbs the moisture in the air layer; when the anti-fogging module operates in the second state, the anti-fogging module is heated to release the moisture into the air layer.

5. The display with anti-fogging function of claim 1, wherein the anti-fogging module and the backlight module are disposed on the same side of the display module.

6. The display with anti-fogging function of claim 1, wherein the backlight module is a direct-type backlight module and comprises a plurality of light-emitting units disposed at intervals on a bottom edge of the backlight module; the anti-fogging module and the plurality of light-emitting units are at least partially overlap in a vertical projection direction of a display surface of the display module.

7. The display with anti-fogging function of claim 1, wherein the backlight module is an edge-lit backlight module and comprises a plurality of light-emitting units disposed at intervals on a side of the backlight module; the anti-fogging module and the plurality of light-emitting units are at least partially overlap in a vertical projection direction of a display surface of the display module.

8. The display with anti-fogging function of claim 1, wherein the display is applied to a vehicle and disposed corresponding to an engine, when the vehicle is activated, both the backlight module and the engine start to operate to generate heat, and the anti-fogging module operating in the second state is heated to release the moisture previously absorbed.

9. The display with anti-fogging function of claim 1, wherein the anti-fogging module operates in the second state to be heated to release the absorbed moisture into the air layer.

10. A display with anti-fogging function, comprising:

a display module having a display surface;

a transparent cover disconnected from and adjacent to the display module, forming an interposing air layer therebetween;

a backlight module, having a first side facing the display module, comprising a plurality of light-emitting units; and an anti-fogging module disposed on a second side of the backlight module and not facing the display module, and the anti-fogging module and the plurality of light-emitting units are at least partially overlap in a vertical projection direction of the display surface, the anti-fogging module comprises a desiccant box attached to a back plane or a light source circuit board of the backlight module, configured to receive heat from the backlight module via conduction directly from the backplate or the light source circuit board and via convection from the air layer.

11. The display with anti-fogging function of claim 10, wherein when the display is not activated, the backlight module is turned off, and the anti-fogging module operates in a first state to absorb moisture inside the display; when the display is activated, the backlight module is turned on and generates heat, and the anti-fogging module operates in a second state to be heated to release the absorbed moisture.

12. The display with anti-fogging function of claim 11, when the anti-fogging module operates in the first state, the anti-fogging module absorbs the moisture in the air layer; when the anti-fogging module operates in the second state, the anti-fogging module is heated to release the moisture into the air layer.

13. The display with anti-fogging function of claim 10, wherein the desiccant box comprises a box body and a desiccant contained in the box body.

14. The display with anti-fogging function of claim 13, wherein the desiccant is a silica gel desiccant.

15. The display with anti-fogging function of claim 10, wherein the backlight module is a direct-type backlight module and the plurality of light-emitting units is disposed at intervals on a bottom edge of the backlight module.

16. The display with anti-fogging function of claim 10, wherein the backlight module is an edge-lit backlight module and the plurality of light-emitting units is disposed at intervals on a side of the backlight module.

17. The display with anti-fogging function of claim 10, wherein the display is applied to a vehicle and disposed corresponding to an engine, when the vehicle is activated, both the backlight module and the engine start to operate to generate heat, and the anti-fogging module operating in the second state is heated to release the moisture previously absorbed.

18. The display with anti-fogging function of claim 11, wherein the anti-fogging module operates in the second state to be heated to release the absorbed moisture into the air layer.

* * * * *